United States Patent
Kuramoto

Patent Number: 6,022,411
Date of Patent: Feb. 8, 2000

[54] SINGLE CRYSTAL PULLING APPARATUS

[75] Inventor: Makoto Kuramoto, Annaka, Japan

[73] Assignee: Super Silicon Crystal Research Institute Corp., Gunma, Japan

[21] Appl. No.: 09/037,513

[22] Filed: Mar. 10, 1998

[30] Foreign Application Priority Data

| Mar. 28, 1997 | [JP] | Japan | 9-094885 |
| Mar. 29, 1997 | [JP] | Japan | 9-094966 |
| Mar. 31, 1997 | [JP] | Japan | 9-096786 |

[51] Int. Cl.⁷ .................................. C30B 35/00
[52] U.S. Cl. .............. 117/218; 117/217; 117/219; 117/911
[58] Field of Search .................. 117/217, 218, 117/219, 911

[56] References Cited

U.S. PATENT DOCUMENTS

| 5,126,113 | 6/1992 | Yamagishi et al. | 117/218 |
| 5,173,270 | 12/1992 | Kida et al. | 117/218 |

FOREIGN PATENT DOCUMENTS

| 62-288191 | 12/1987 | Japan . |
| 63-252991 | 10/1988 | Japan . |
| 3285893 | 12/1991 | Japan . |
| 3295893 | 12/1991 | Japan . |
| 4321583 | 11/1992 | Japan . |
| 5270968 | 10/1993 | Japan . |
| 5270974 | 10/1993 | Japan . |
| 5270975 | 10/1993 | Japan . |
| 5270976 | 10/1993 | Japan . |
| 7172981 | 7/1995 | Japan . |
| 9-2893 | 1/1997 | Japan . |

*Primary Examiner*—Pelisa Hiteshew
*Attorney, Agent, or Firm*—McDermott, Will & Emery

[57] ABSTRACT

The object of the present invention is to prevent the single crystal during pulling operation from turning to polycrystal when the single crystal under pulling operation is gripped by a gripper and to achieve the gripping automatically. When a wire 1 is moved down to immerse a seed crystal 3 into surface of a Si melt 11 in a quartz crucible 10, arms 12 and 13 wait at such positions that tips do not come into contact with the Si melt 11, and tips of the gripping arm 12 are opened so that the tips are not brought into contact with a portion with larger diameter 5 during pulling operation. By pulling up the wire 1, a neck portion 4, a portion with larger diameter 5, a constricted portion 6, and a crystal main portion 7 are formed under the seed crystal 3. When a sensor 14 detects that upper surface of the portion with larger diameter 5 has come into contact with the tips of the contact/detecting arm 13 during pulling operation, tips of the gripping arm 12 are closed and grip the constricted portion 6. When gripping is completed, the wire 1 and the arms 12 and 13 are pulled up while integrally being rotated.

14 Claims, 5 Drawing Sheets

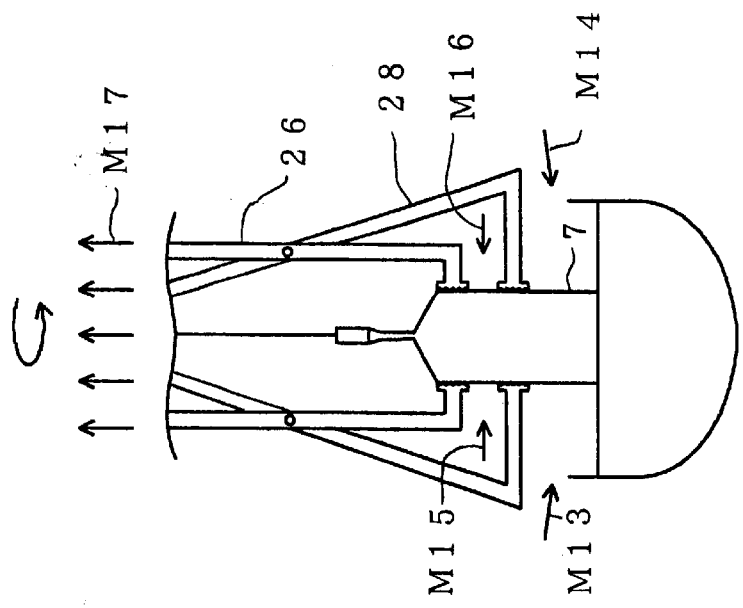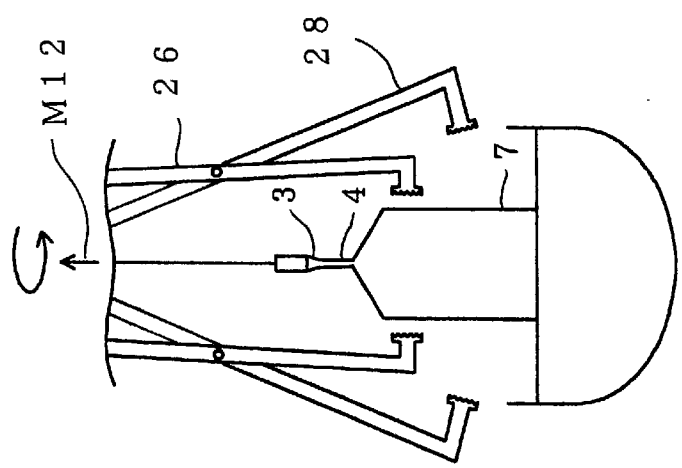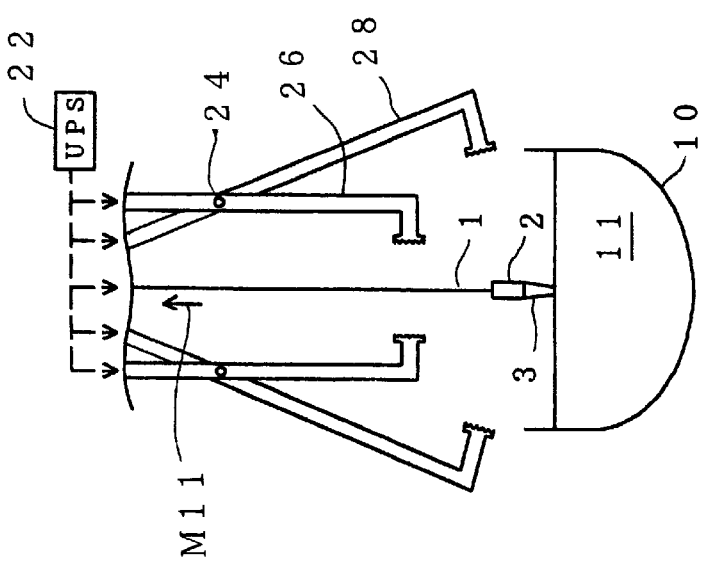

SINGLE CRYSTAL PULLING APPARATUS

BACKGROUND OF THE INVENTION

1. Field of the Invention

The present invention relates to a single crystal pulling apparatus for manufacturing a dislocation-free single crystal of silicon by Czochralski method.

2. Description of the Prior Art

In a single crystal manufacturing apparatus based on the pulling Czochralski (CZ) method, fresh argon (Ar) gas is supplied into a highly pressure-proof airtight chamber where pressure is reduced to about 10 torr in advance and polycrystal in a quartz crucible arranged in the lower portion of the chamber is melted by heating. Then, a seed crystal is immersed into surface of the melt from above, and by rotating and moving up and down the seed crystal and the quartz crucible, the seed crystal is pulled up. As a result, a single crystal (the so-called ingot) is grown, which comprises an upper cone portion with its upper end protruding, a cylindrical body portion, and a lower cone portion with its lower end protruding, all under the seed crystal.

As a method to grow as described above, Dash method is known. According to this method, in order to eliminate dislocation (i.e. in order to turn to dislocation-free), which occurs in the seed crystal due to thermal shock when the seed crystal is immersed to the surface of the melt, pulling rate is relatively increased after immersing the seed crystal to the surface of the melt so that a neck portion having smaller diameter than the seed crystal, e.g. 3 to 4 mm, is formed, and pulling of the upper cone portion is started.

Further, a single crystal having large diameter and heavy weight (150 to 200 kg or more) cannot be pulled up via the neck portion with small diameter, and a method has been proposed, for example, in JP-B-5-65477. According to this method, a neck portion with small diameter is formed by Dash method, and the pulling rate is then relatively slowed down and a portion with larger diameter is formed. Then, the pulling rate is relatively increased, and a portion with small diameter is formed. Thus, a "spherical constricted portion" is formed, and by gripping this constricted portion with a gripper, the single crystal having large diameter and heavy weight is pulled up. Also, a conventional type apparatus for gripping the constricted portion is proposed, for example, in JPB-7-103000 and JP-B-7-515.

As other conventional examples, a method for directly gripping a body portion with a "constricted portion" as described above has been proposed, for example, in JP-A-5-270974 or JPA-7-172981. Also, a method to form a "ring-like constricted portion" having a larger diameter than the body portion between the upper cone portion and the body portion instead of the above "spherical constricted portion" and to grip this "ring-like constricted portion" has been proposed in JP-A-63-252991 and JP-A-5-270975.

However, it is very delicate matter to determine the timing to grip the above "constricted portion" by a gripping member during pulling of single crystal. If the timing to grip is deviated, the single crystal under pulling operation may be turned to polycrystal. Also, a plurality of single crystal manufacturing apparatuses are usually aligned in the manufacturing factory, and in case a small number of workers are in charge of gripping operation, it may lead not only to poor working efficiency but also to a possibility to cause deviation in the timing to grip.

The gripper for gripping the "constricted portion" during pulling operation of single crystal is used repeatedly, and when the gripper is damaged due to fatigue, single crystal may be dropped down. Because the gripper is generally driven by a motor, gripping power is decreased during power suspension, and single crystal may be dropped down. In the method to grip the "constricted portion" as described above, if the "constricted portion" is damaged, single crystal may be dropped down. If single crystal is dropped down, dislocation may occur, and the single crystal is not qualified as a product any more. Also, when quartz crucible is damaged, high temperature melt may react in the worse case with the cooling water inside the crucible shaft, which rotates and moves up and down the quartz crucible. As a result, vapor explosion may occur.

SUMMARY OF THE INVENTION

To solve the above problems, it is an object of the present invention to provide a single crystal pulling apparatus, by which it is possible to prevent the turning of single crystal under pulling operation to polycrystal when the single crystal under pulling operation is gripped by a gripper, and also to grip the single crystal automatically, and further to prevent the dropping of the single crystal during pulling operation.

To attain the above object, an apparatus according to a first aspect of the present invention comprises a contact member, which comes into contact with upper surface of a portion with larger diameter of a single crystal formed under a seed crystal and presses down the portion with larger diameter from above, and the single crystal is supported from above and below using the contact member and the gripper, which grips the constricted portion of the single crystal formed under the portion with larger diameter.

Accordingly, there is provided a A single crystal pulling apparatus, comprising:

seed crystal pulling means for pulling a seed crystal while rotating a seed crystal holder for supporting the seed crystal;

a contact member rotatable together with said seed crystal holder and movable in vertical direction, and having function to push down a portion with larger diameter of a single crystal from above after upper surface of said portion with larger diameter of the single crystal formed under said seed crystal by pulling using said seed crystal pulling means is contactably arranged;

a gripping member rotatable together with said seed crystal holder and said contact member and movable in vertical direction and having a tip thereof opened or closed to grip a constricted portion of the single crystal formed under said portion with larger diameter by pulling using said seed crystal pulling means; and moving means for moving a tip of said gripping member toward lower surface of said portion with larger diameter so that, when upper surface of said portion with larger diameter of the single crystal under pulling is brought into contact with said contact member a tip of said gripping member is closed and said constricted portion is gripped by cooperative action with said contact member.

To attain the above object, an apparatus according to a second aspect of the present invention comprises a contact member, which comes into contact with a shoulder portion of a single crystal formed further below of the portion with larger diameter under the seed crystal and presses down the shoulder portion from above, whereby upward and downward forces are applied on the single crystal by the contact member and the gripping member to grip the constricted portion of the single crystal formed immediately under the portion with larger diameter and to support it.

Accordingly, there is provided a single crystal pulling apparatus, comprising:

seed crystal pulling means for pulling a seed crystal while rotating a seed crystal holder for supporting the seed crystal;

a gripping member rotatable together with said seed crystal holder, movable in vertical direction and having a tip thereof opened and closed to grip a constricted portion of a single crystal formed under a portion with larger diameter of the single crystal to be formed below said seed crystal by pulling using said seed crystal pulling means;

a contact member rotatable together with said seed crystal holder and said gripping member and movable in vertical direction when upper surface of said portion with larger diameter of the single crystal under pulling is brought into contact with said contact member, and having such function that, after a shoulder portion of the single crystal formed under said portion with larger diameter by pulling using said seed crystal pulling means is contactably arranged and said shoulder portion is brought into contact, and said shoulder portion is pushed down from above; and moving means for moving a tip of said gripping member toward the lower surface of said portion with larger diameter when the upper surface of said shoulder portion of the single crystal under pulling is brought into contact with said contact member so that the tip of said gripping member is closed and said constricted portion is gripped.

To attain the above object, an apparatus according to a third aspect of the present invention is arranged to use, for gripping a singly crystal, gripping members of 2 kinds which grip the single crystal at different positions respectively.

Accordingly, there is provided a single crystal pulling apparatus, comprising:

seed crystal pulling means for pulling a seed crystal while rotating a seed crystal holder for supporting the seed crystal;

first gripping means for gripping a first gripping position of a single crystal formed under said seed crystal by pulling using said seed crystal pulling means; and a second gripping means for gripping a second gripping position of the single crystal formed under said seed crystal by pulling using said seed crystal pulling means.

BRIEF DESCRIPTION OF THE DRAWINGS

The above-mentioned objects and features will become more raedily apparent from the following description of the embodiment taken in conjunction with the accompanying drawings in which:

FIGS. 5A, 5B and 5C are explanatory diagrams of a fourth embodiment of the single crystal pulling apparatus according to the present invention and a pulling process of the apparatus.

DETAILED DESCRIPTION OF THE PREFERRED EMBODIMENTS

In the following, description will be given on preferred embodiments of the present invention referring to the attached drawings.

(1st Embodiment)

Figure 1A:
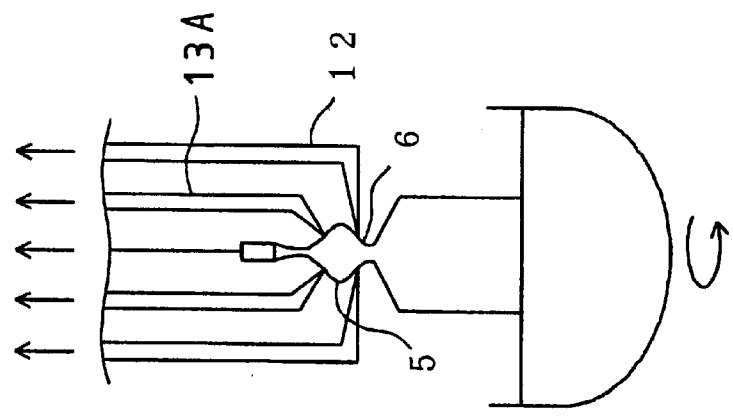
FIGS. 1A, 1B and 1C are explanatory diagrams of a first embodiment of the single crystal pulling apparatus according to the present invention and a pulling process of the apparatus.
Figure 1B:
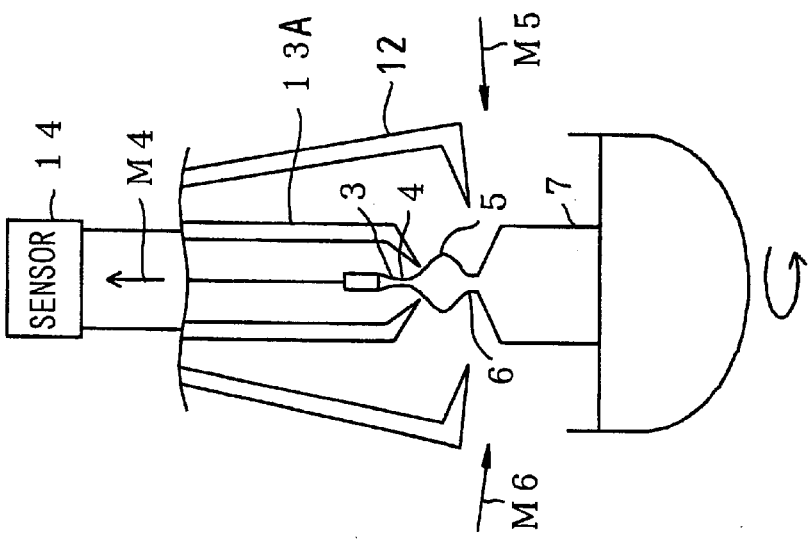
Figure 1C:
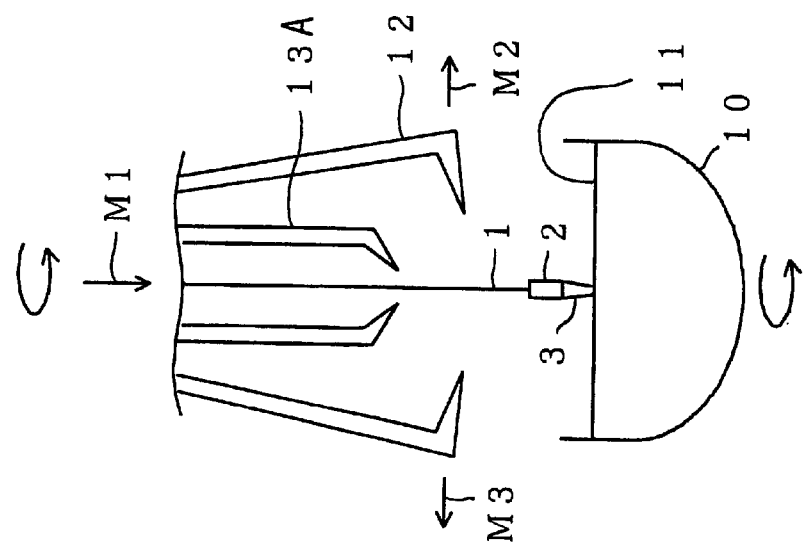

FIGS. 1A, 1B and 1C each represents a first embodiment of a single crystal pulling apparatus of the present invention and a pulling process.

In FIGS. 1A, 1B and 1C, a seed crystal holder 2 is mounted at the tip of a wire 1 (or a shaft may be used), and a seed crystal 3 is disposed on the seed crystal holder 2. The wire 1 is designed in such manner that it is wound up on a wire winding drum by operating a wire winding motor (not shown), and the wire winding drum and the wire winding motor are designed to be rotated by a drum rotating motor (not shown). After the seed crystal 3 is immersed into a Si melt 11 in a quartz crucible 10, it is pulled up so that a neck portion 4, a portion with larger diameter 5 for supporting, a constricted portion 6, and a crystal main portion 7 are formed under the seed crystal 3.

Around the wire 1, there are provided two or more gripping arms 12 for gripping the constricted portion 6 under the portion with larger diameter 5 and a contact/detecting arm 13A to contact and detect upper surface of the portion with larger diameter 5 in such manner that these are rotated together with the wire 1. The tip of the gripping arm 12 can be opened or closed to grip the constricted portion 6 and can be moved up or down to pull up the constricted portion 6 while gripping. The contact/detecting arm 13A is designed in such manner that it can be moved up or down at the same time as the pulling operation. As a mechanism to open or close the gripping arm 12, a rack-and-pinion mechanism driven by a motor or an actuator such as air cylinder may be used. The contact/detecting arm 13A is connected with a sensor, which is used to detect that the tip of the arm is brought into contact with upper surface of the portion with larger diameter 5 during pulling. As the sensor 14, an electric resistance type sensor, a current detecting type sensor, or a weight load detecting type sensor may be used. The wire 1 and the arms 12 and 13A are integrally and rotatably supported with each other.

Figure 2:
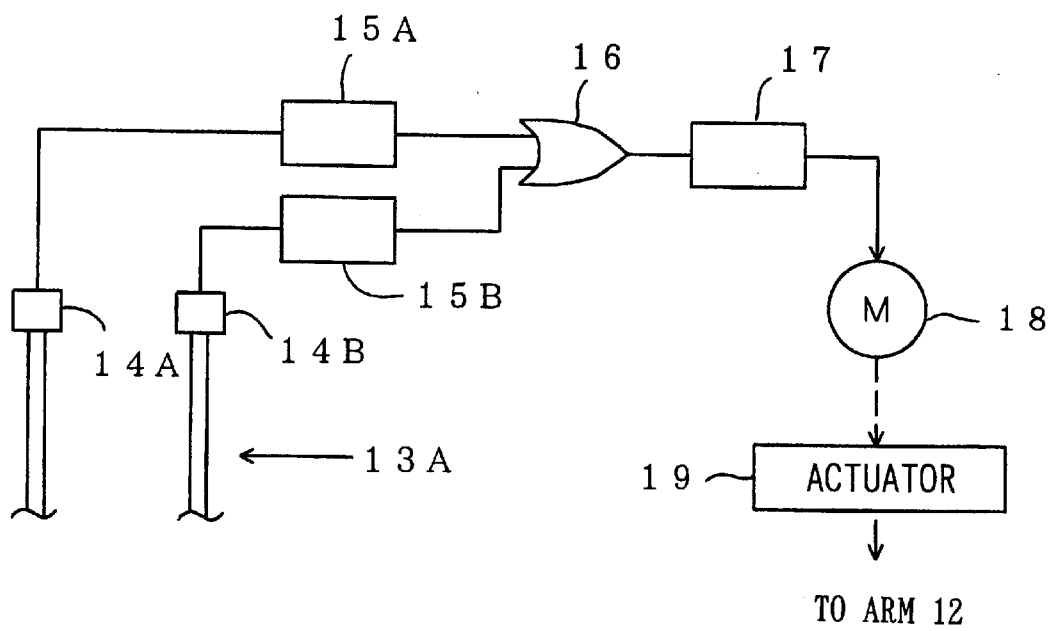
FIG. 2 is a schematical block diagram of a device for controlling opening and closing of arms functioning as a gripping member of FIGS. 1A, 1B and 1C.

FIG. 2 is a schematic block diagram of a control unit to control closing of the arm 12 by detecting of the sensor 14. The sensor 14 comprises sensor elements 14A and 14B for detecting movement of arms 13A. Output signals of the sensor elements are compared with the predetermined threshold values on amplifying and detecting circuits 15A and 15B respectively, and a detection signal is obtained, which is inputted to a switching circuit 17 via an OR circuit 16. When one of the sensor elements 14A and 14B detects contact of the arm 13A with the portion with larger diameter 5, the switching circuit 17 sends electric current to a motor 18. An actuator 19 is actuated, and the arm 12 is moved, and the arm is closed as shown in FIG. 1C from the condition of FIG. 1B.

When a single crystal main portion 7 is manufactured under the arrangement as described above, pressure in a chamber (not shown) is reduced to about 10 torr, and fresh argon gas is supplied. At the same time, polycrystal in the quartz crucible 10 disposed in the lower portion of the chamber is heated and melted. Also, as shown in FIG. 1A, the wire 1 is moved down in the direction of an arrow M1, and the seed crystal 3 is immersed into surface of the Si melt 11 in the quartz crucible 10. In this case, the arms 12 and 13A wait at such positions that tips thereof are not brought into contact with the Si melt 11, and the tips of the gripping arm 12 are opened so that the tips do not come into contact with the portion with larger diameter 5 in pulling operation (arrows M2 and M3).

Next, as shown in FIG. 1B, the seed crystal 3 is pulled up in the direction of an arrow M4 relatively quickly after a predetermined time has elapsed, and a neck portion 4 with smaller diameter, i.e. 3 to 4 mm, is formed under the seed crystal 3. Then, after the pulling rate is relatively slowed down and the portion with larger diameter 5 for supporting is formed under the neck portion 4, the pulling rate is relatively increased to form the constricted portion 6 under the portion with larger diameter 5. Then, formation of the crystal main portion 7 is started.

As shown in FIG. 1B, when the sensor 14 detects that the upper surface of the portion with larger diameter 5 is brought into contact with the tip of the contact/detecting arm 13A during pulling operation, the gripping arm 12 is driven by the actuator 19 so that its tip is closed as shown by arrows M5 and M6. As a result, the tips of the gripping arm 12 enter under the portion with larger diameter 5 as shown in FIG. 1C, and the constricted portion 6 is gripped. In this case, it is desirable that the contact/detecting arm 13A is not moved upward until gripping by the gripping arm 12 is completed so that the crystal main portion 7 is not turned to polycrystal due to vibration caused by gripping. Specifically, the contact/detecting arm 13A, serving as a contact member, has the function to press down the portion with larger diameter 5 from above. On the other hand, the gripping arm 12 grips the portion with larger diameter 5 to lift up the latter from below. Thus, the portion with larger diameter 5 is sandwiched by the arms 12 and 13A from above and below. When the gripping is completed, the wire 1 and the arms 12 and 13A are pulled up while integrally being rotated.

In the above embodiment 1, the sensor 14 is provided on the side of the contact/detecting arm 13A, while it may be provided on the side of the wire 1 (or shaft), which constitutes a seed crystal lift mechanism, and the arm 13A may be provided only with the contact function to press down the upper surface of the portion with larger diameter 5. Further, an optical sensor or a combination of a photographing apparatus and an image processing apparatus, i.e. non-contact type sensors, may be used to detect that the arm 13A and the portion with larger diameter 5 are in contact with each other, and the timing to drive the gripping arm 12 may be determined depending upon the detection.

(2nd Embodiment)

Figure 3C:
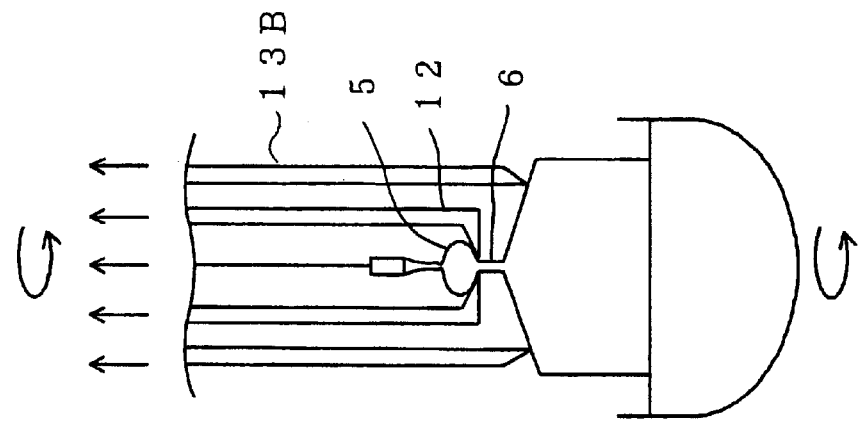
FIGS. 3A, 3B and 3C are explanatory diagrams of a second embodiment of the single crystal pulling apparatus according to the present invention and a pulling process of the apparatus.
Figure 3B:
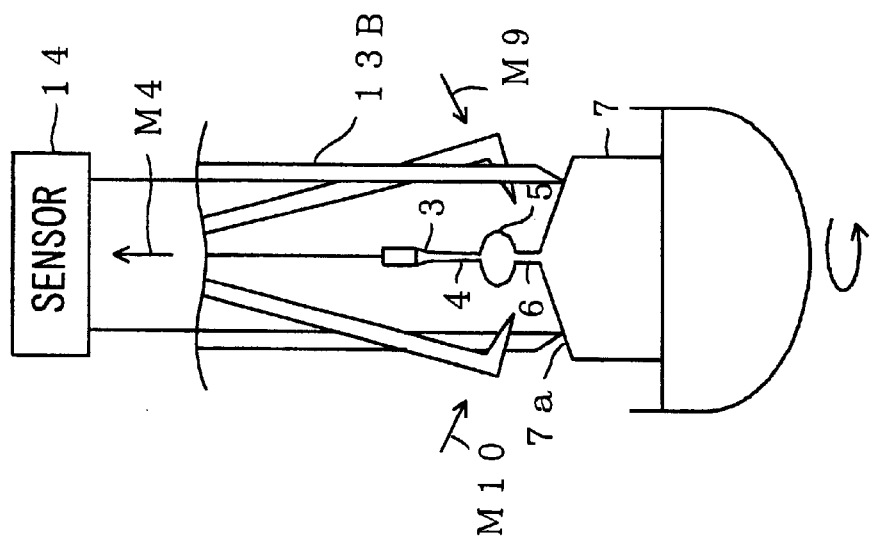
Figure 3A:
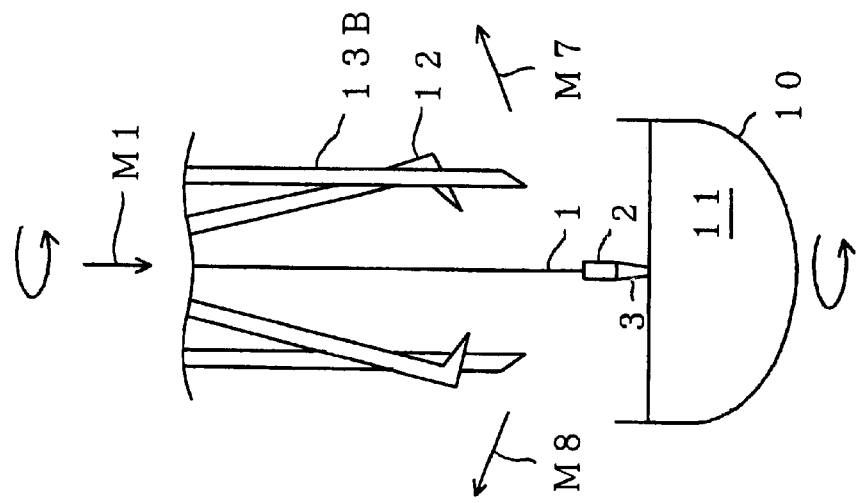

FIGS. 3A, 3B, and 3C each represents a second embodiment of a single crystal pulling apparatus of the present invention and a pulling process.

In FIGS. 3A, 3B, and 3C, a seed crystal holder 2 is mounted at the tip of a wire 1 (or a shaft may be used), and a seed crystal 3 is disposed on the seed crystal holder 2. The wire 1 is designed in such manner that it is wound up on a wire winding drum by operating a wire winding motor (not shown), and the wire winding drum and the wire winding motor are designed to be rotated by a drum rotating motor (not shown). After the seed crystal 3 is immersed into a Si melt 11 in a quartz crucible 10, it is pulled up so that a neck portion 4, a portion with larger diameter 5 for supporting, a constricted portion 6, and a crystal main portion 7 are formed under the seed crystal 3.

Around the wire 1, there are provided two or more gripping arms 12 for gripping the constricted portion 6 under the portion with larger diameter 5 and a contact/detecting arm 13B which comes into contact with a shoulder portion 7a and to detect it, and these are arranged in such manner as to rotate together with the wire 1. The shoulder portion 7a is the upper surface of the body portion of the single crystal and it is the so-called upper cone portion. The tip of the gripping arm 12 can be opened or closed to grip the constricted portion 6 and also can be moved up or down to pull up the constricted portion 6 while gripping. The contact/detecting arm 13B can be moved up or down at the same time as the pulling operation. As a mechanism to open or close the gripping arm 12, a rack-and-pinion mechanism driven by a motor or an actuator such as air cylinder may be used. The contact/detecting arm 13B is connected with a sensor, which is used to detect that the tip of the arm is brought into contact with the shoulder portion 7a during pulling. As the sensor 14, an electric resistance type sensor, a current detecting type sensor, or a weight load detecting type sensor may be used. The wire 1 and the arms 12 and 13B are integrally and rotatably supported with each other.

In the second embodiment, also, control can be performed using the control unit of FIG. 2. Specifically, when one of the sensor elements 14A and 14B detects contact of the arm 13B with the shoulder portion 7a, the switching circuit 17 as shown in FIG. 2 supplies electric current to the motor 18. As a result, the actuator 19 is actuated, and the arm 12 is moved. The tips of the arms enter immediately under the portion with larger diameter 5, and it is turned to closed state shown in FIG. 3C from the condition of FIG. 3B.

In case the single crystal main portion 7 is manufactured under the above arrangement, pressure in a chamber (not shown) is reduced to about 10 torr, and fresh argon gas is supplied. At the same time, polycrystal in the quartz crucible 10 arranged in the lower portion of the chamber is heated and melted. Also, the wire 1 is moved down in the direction of an arrow M1 shown in FIG. 3A so that the seed crystal 3 is immersed into the surface of the Si melt 11 in the quartz crucible 10. In this case, the tips of the arms 12 and 13B wait at such positions that these are not brought into contact with the Si melt 11. The tips of the gripping arm 12 are opened so that it does not come into contact with the portion with larger diameter 5 during pulling operation (arrows M7 and M8).

Next, as shown in FIG. 3B, the seed crystal 3 is pulled up in the direction of the arrow M4 relatively quickly after a predetermined time has elapsed, and a neck portion 4 with small diameter, i.e. 3 to 4 mm, is formed under the seed crystal 3. Then, the pulling rate is relatively slowed down to form a portion with larger diameter 5 under the neck portion 4, and by relatively increasing the pulling rate, the constricted portion 6 is formed under the portion with larger diameter 5. Then, by gradually slowing down the pulling rate, a shoulder portion 7a is formed under the constricted portion 6. Next, by keeping the pulling rate at constant level, formation of a cylindrical crystal main portion (body portion) is started.

As shown in FIG. 3B, when the sensor 14 detects that the shoulder portion 7a is brought into contact with tips of the contact/detecting arm 13B during pulling operation, the actuator 19 is actuated to close the tips of the gripping arm 12 as shown by arrows M9 and M10. As a result, as shown in FIG. 3C, tips of the gripping arm 12 enter under the portion with larger diameter 5 and grip the constricted portion 6. In this case, it is desirable that the contact/detecting arm 13B is not moved up until gripping by the gripping arm 12 is completed so that the crystal main portion 7 is not turned to polycrystal due to vibration caused by the gripping. Specifically, the contact/detecting arm 13B, serving as a contact member, has the function to press down the shoulder portion 7a from above, and the gripping arm 12 grips the portion with larger diameter 5 from below. Thus, the single crystal is gripped by forces applied in reverse directions, i.e. upward and downward, by the arms 12 and 13B. When gripping is completed, the wire 1 and the arms 12 and 13B are pulled up while integrally being rotated.

When gripping is completed, the contact/detecting arm 13B may be moved up or tips may be opened so that the arm does not come into contact with the shoulder portion 7a. In the above embodiment, the sensor 14 is provided on the side of the contact/detecting arm 13B, while it may be provided on the side of the wire 1 (or shaft), and the arm 13B may be provided only with the function to press down the shoulder portion 7a. Further, an optical sensor or a combination of a photographing apparatus and an image processing apparatus, i.e. non-contact type sensors, may be used to detect that the arm 13B and the shoulder portion 7a are in contact with each other, and the timing to drive the gripping arm 12 may be determined.

(3rd Embodiment)

Figure 4C:
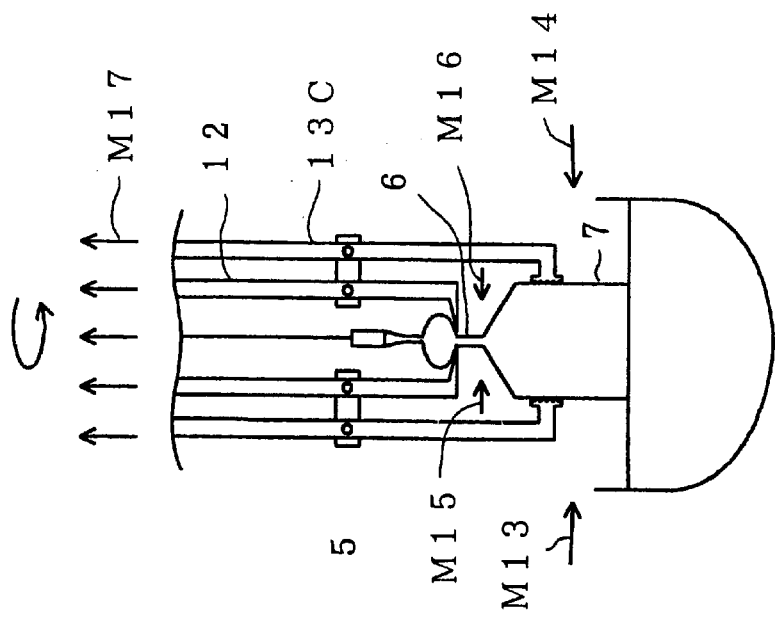
FIGS. 4A, 4B and 4C are explanatory diagrams of a third embodiment of the single crystal pulling apparatus according to the present invention and a pulling process of the apparatus.
Figure 4B:
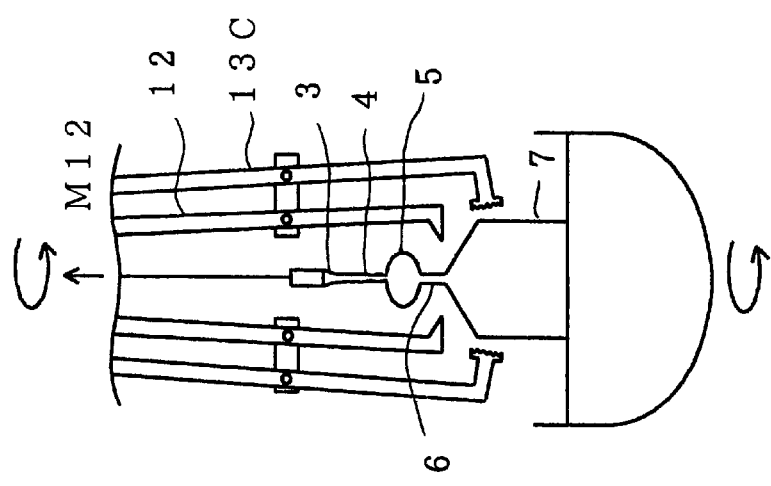
Figure 4A:
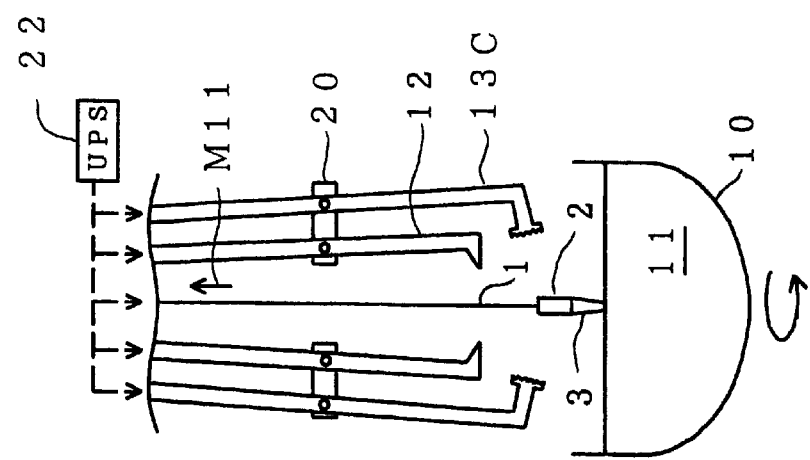

FIGS. 4A, 4B, and 4C each represents a third embodiment of a single crystal pulling apparatus of the present invention and a pulling process.

In FIG. 1, a seed crystal holder 2 is mounted at the tip of a wire 1 (or a shaft may be used), and a seed crystal 3 is disposed on the seed crystal holder 2. The wire 1 is designed in such manner that it is wound up on a wire winding drum by operating a wire winding motor (not shown), and the wire winding drum and the wire winding motor are designed to be rotated by a drum rotating motor (not shown). After the seed crystal 3 is immersed into a Si melt 11 in a quartz crucible 10, it is pulled up so that a neck portion 4, a portion with larger diameter 5 for supporting, a constricted portion 6, and a crystal main portion 7 are formed under the seed crystal 3.

Around the wire 1, there are provided two or more of a first gripping arms 12 for gripping a constricted portion 6 under a portion with larger diameter 5 and two or more of a second gripping arms 13C for gripping a body portion 7, and these are connected by connecting arms 20 with each other. Tips of the gripping arms 12 and 13C can be opened or closed by an arm opening/closing motor (not shown) to grip the constricted portion 6 and the body portion 7, and the arms can be moved up or down by an up/down moving motor (not shown) to pull up the constricted portion 6 and the body portion 7 under gripping condition, and the arms are also rotatably driven together with the wire 1 by a drum rotating motor. Electric current to all of these motors is supplied from an uninterruptive power source (UPS) 22 for emergency. The UPS 22 can supply electric current continuously even during power suspension, and it can prevent abrupt stop of rotation of the seed crystal holder 2 or reduction of gripping power of the gripping arms 12 and 13C.

When the single crystal main portion 7 is manufactured under the above arrangement, pressure in a chamber (not shown) is reduced to about 10 torr, and fresh argon gas is supplied. At the same time, polycrystal in the quartz crucible 10 arranged in the lower portion of the chamber is heated and melted. Also, the wire 1 is moved down as shown in FIG. 4A and the seed crystal 3 is immersed to and adapted with the surface of the Si melt 11 in the quartz crucible 10. In this case, the arms 12 and 13C wait at such positions that the tips do not come into contact with the Si melt 11. Also, the tips of the arms 12 and 13C are opened to avoid the contact with the portion with larger diameter 5 and the body portion 7 during pulling operation. Next, after a predetermined time has elapsed, the wire 1 is pulled up in the direction of arrow M1 in FIG. 4A, and the seed crystal 3 is pulled up.

Next, as shown in FIG. 4B, the seed crystal 3 is pulled in the direction of the arrow M12 at relatively high rate, and a neck portion 4 with small diameter, i.e. 3 to 4 mm, is formed under the seed crystal 3. Then, the pulling rate is relatively slowed down, and a portion with larger diameter 5 is formed under the neck portion 4. Then, the pulling rate is relatively increased to form a constricted portion 6 under the portion with larger diameter 5. Then, formation of the body portion 7 is started.

When the portion with larger diameter 5 and the body portion 7 are lifted up to the position of the tips of the arms 12 and 13C during pulling operation as shown in FIG. 4B, the tips of the arms 12 and 13C are moved in directions shown by the arrows M13, M14, M15 and M16 as shown in FIG. 4C, i.e. the tips are moved in radial direction with respect to the axis of the single crystal and are closed. Thus, the constricted portion 6 and the body portion 7 are gripped. When gripping is completed, the wire 1 and the arms 12 and 13C are pulled up in the direction of the arrow M17 while integrally being rotated. The arms 12 and 13C may be opened or closed in such manner that the tips of the arm 13C are closed after the tips of the arm 12 have been closed. That is, the arms 12 and 13C need not be closed at the same time.

(4th Embodiment)

Next, description will be given on a fourth embodiment of a single crystal pulling apparatus of the present invention referring to FIGS. 5A, 5B, and 5C. In the fourth embodiment, the portion with larger diameter 5 and the constricted portion 6 to support single crystal are not provided as in the third embodiment. Instead, a body portion 7 is provided under the neck portion 4, and a first gripping arm 26 and a second gripping arm 28 grip the body portion 7. The arms 26 and 28 are connected with each other via a pivot 24.

When the single crystal main portion is manufactured under the above arrangement, the wire 1 is moved down as shown in FIG. 5A so that the seed crystal 3 is immersed in and adapted to the surface of the Si melt 11 in the quartz crucible 10. In this case, the tips of the arms 26 and 28 wait at such positions that the tips of the arms do not come into contact with the Si melt 11, and the tips of the arms 26 and 28 are opened to avoid contact with the body portion 7 during pulling operation. Next, after a predetermined time has elapsed, the wire 1 is pulled up from the condition shown in FIG. 5A in a direction shown by the arrow M11 to pull up the seed crystal 3. By pulling up the seed crystal 3 in the direction of the arrow M12 at relatively high pulling rate as shown in FIG. 5B, a neck portion 4 with small diameter, i.e. 3 to 4 mm, is formed under the seed crystal 3. Next, by gradually slowing down the pulling rate, a cone portion is formed under the neck portion 4. Then, by keeping the pulling rate at constant level, formation of the body portion 7 under the cone portion is started.

When the body portion 7 is moved up to the level of the tips of the arms 26 and 28 during pulling operation as shown in FIG. 5B, the tips of the arms 26 and 28 are moved in directions shown by the arrows M13, M14, M15, and M16 as shown in FIG. 5C, i.e. in radial direction with respect to the axis of the single crystal. Thus, the tips are closed and grip the body portion 7. When gripping is completed, the wire 1 and the arms 26 and 28 are pulled up in the direction shown by the arrow M17 while integrally being rotated. The opening and the closing of the arms 26 and 28 may be controlled in such manner that the tips of the arm 28 may be closed after the tips of the arm 26 have been closed. That is, the arms 26 and 28 need not be closed at the same time.

As described above, the apparatus according to the first aspect of the present invention comprises a contact member, which comes into contact with and presses down upper surface of a portion with larger diameter of a single crystal formed under a seed crystal, and the single crystal is gripped by the contact member and the gripping member, which grips a constricted portion of the single crystal formed under the portion with larger diameter, i.e. by the actions of the contact member and the gripping member. As a result, when the single crystal under pulling operation is gripped by the gripping member, it can be gripped in reliable and stable manner, and the single crystal is prevented from turning to polycrystal during the pulling operation.

Also, the sensor can detect that the upper surface of the portion with larger diameter of the single crystal is brought into contact with the contact member during pulling operation or that these are in such relationship as to come into contact with each other, and gripping can be achieved automatically by gripping the constricted portion. Therefore, there is no need to worry about how to determine the timing to grip the portion with larger diameter, and a single crystal having larger diameter and heavy weight can be pulled up in safe and reliable manner.

The apparatus according to the second aspect of the present invention comprises a contact member, which comes into contact with and presses down a shoulder portion of a single crystal formed under a seed crystal, and the single crystal is gripped by the contact member and the gripping member, which grips a constricted portion of the single crystal formed under the portion with larger diameter. As a result, when the single crystal under pulling condition is gripped by the gripping member, it can be gripped in reliable and stable manner, and the single crystal is prevented from turning to polycrystal during the pulling operation.

Also, the sensor can detect that the shoulder portion of the single crystal is brought into contact with the contact member during pulling operation or that these are in such relationship as to come into contact with each other, and gripping can be achieved automatically by gripping the constricted portion. Therefore, there is no need to worry about how to determine the timing to grip the portion with larger diameter, and the single crystal having larger diameter and heavy weight can be pulled up in safe and reliable manner.

According to the third aspect of the present invention, the gripper is designed in safe dual structure to grip the single crystal at different positions. As a result, it is possible to prevent dropping of the single crystal even when the gripper or the single crystal are damaged during pulling operation, and also to avoid dropping of the single crystal during power suspension because power is supplied from an uninterruptive power source (UPS) to the driving unit of the gripper. Further, by designing in such manner that power is supplied to the seed crystal pulling means from UPS, it is possible to prevent the seed crystal from being damaged when rotation of the single crystal is abruptly stopped during power suspension.

What is claimed is:

1. A single crystal pulling apparatus, comprising:
   seed crystal pulling means for pulling a seed crystal while rotating a seed crystal holder for supporting the seed crystal;
   a contact member rotatable together with said seed crystal holder and movable in vertical direction, and having a function to push down a portion with a larger diameter of a single crystal from above after an upper surface of said portion with a larger diameter of the single crystal formed under said seed crystal by pulling using said seed crystal pulling means is contactably arranged;
   a gripping member rotatable together with said seed crystal holder and said contact member and movable in vertical direction and having a tip thereof opened or closed to grip a constricted portion of the single crystal formed under said portion with a larger diameter by pulling using said seed crystal pulling means; and
   moving means for moving a tip of said gripping member toward a lower surface of said portion with a larger diameter so that, when said upper surface of said portion with a larger diameter of the single crystal under pulling is brought into contact with said contact member a tip of said gripping member is closed and said constricted portion is gripped by a cooperative action with said contact member.

2. A single crystal pulling apparatus according to claim 1, wherein said contact member is provided with a sensor for detecting that the upper surface of the portion with larger diameter of the single crystal under pulling is brought into contact with said contact member, and said moving means is controlled according to a detection signal of said sensor.

3. A single crystal pulling apparatus according to claim 2, wherein said sensor is an electric type sensor for detecting electric resistance or electric current.

4. A single crystal pulling apparatus according to claim 2, wherein said sensor is a sensor for detecting a load of said seed crystal pulling means.

5. A single crystal pulling apparatus according to claim 1, wherein said seed crystal pulling means is provided with a sensor for detecting that the upper surface of the portion with larger diameter of the single crystal under pulling is brought into contact with said contact member, and said moving means is controlled according to a detection signal of said sensor.

6. A single crystal pulling apparatus, comprising:
   seed crystal pulling means for pulling a seed crystal while rotating a seed crystal holder for supporting the seed crystal;
   a contact member rotatable together with said seed crystal holder and movable in vertical direction, and having a function to push down a portion with a larger diameter of a single crystal from above after an upper surface of said portion with a larger diameter of the single crystal formed under said seed crystal by pulling using said seed crystal pulling means is contactably arranged;
   a gripping member rotatable together with said seed crystal holder and said contact member and movable in vertical direction and having a tip thereof opened or closed to grip a constricted portion of the single crystal formed under said portion with a larger diameter by pulling using said seed crystal pulling means; and
   position detecting means for detecting that said upper surface of said portion with a larger diameter of the single crystal under pulling has been pulled up to a predetermined position; and
   moving means for moving a tip of said gripping member toward the lower surface of said portion with a larger diameter so that the tip of said gripping member is closed and said constricted portion is gripped by a mutual action with said contact member in response to detection by said position detecting means.

7. A single crystal pulling apparatus according to claim 6, wherein there is provided detecting means for detecting that said position detecting means is at a position to bring said portion with larger diameter into contact with said contact member.

8. A single crystal pulling apparatus, comprising:

seed crystal pulling means for pulling a seed crystal while rotating a seed crystal holder for supporting the seed crystal;

a gripping member rotatable together with said seed crystal holder, movable in vertical direction and having a tip thereof opened and closed to grip a constricted portion of a single crystal formed under a portion with larger diameter of the single crystal to be formed below said seed crystal by pulling using said seed crystal pulling means;

a contact member rotatable together with said seed crystal holder and said gripping member and movable in vertical direction when upper surface of said portion with larger diameter of the single crystal under pulling is brought into contact with said contact member, and having such function that, after a shoulder portion of the single crystal formed under said portion with larger diameter by pulling using said seed crystal pulling means is contactably arranged and said shoulder portion is brought into contact, and said shoulder portion is pushed down from above; and moving means for moving a tip of said gripping member toward the lower surface of said portion with larger diameter when the upper surface of said shoulder portion of the single crystal under pulling is brought into contact with said contact member so that the tip of said gripping member is closed and said constricted portion is gripped.

9. A single crystal pulling apparatus according to claim 8, wherein said contact member is provided with a sensor for detecting that the upper surface of the portion with larger diameter of the single crystal under pulling is brought into contact with said contact member and said moving means is controlled according to a detection signal of said sensor.

10. A single crystal pulling apparatus according to claim 9, wherein said sensor is an electric sensor for detecting electric resistance or electric current.

11. A single crystal pulling apparatus according to claim 9, wherein said sensor is a sensor for detecting a load of said seed crystal pulling means.

12. A single crystal pulling apparatus according to claim 8, wherein said seed crystal pulling means is provided with a sensor for detecting that the upper surface of the portion with larger diameter of the single crystal under pulling is brought into contact with said contact member, and said moving means is controlled according to a detection signal of said sensor.

13. A single crystal pulling apparatus, comprising:

seed crystal pulling means for pulling a seed crystal while rotating a seed crystal holder for supporting the seed crystal;

a gripping member rotatable together with said seed crystal holder, movable in vertical direction and having a tip thereof opened and closed to grip a constricted portion of a single crystal formed under a portion with a larger diameter of the single crystal to be formed below said seed crystal by pulling using said seed crystal pulling means;

a contact member rotatable together with said seed crystal holder and said gripping member and movable in vertical direction when an upper surface of said portion with a larger diameter of the single crystal under pulling is brought into contact with said contact member, and having such function that, after a shoulder portion of the single crystal formed under said portion with a larger diameter by pulling using said seed crystal pulling means is contactably arranged and said shoulder portion is brought into contact, and said shoulder portion is pushed down from above;

position detecting means for detecting that said shoulder portion of the single crystal under pulling has been pulled up to a predetermined position; and moving means for moving a tip of said gripping member toward the lower surface of said portion with a larger diameter so that the tip of said gripping member is closed and said constricted portion is gripped in response to detection by said position detecting means.

14. A single crystal pulling apparatus according to claim 13, wherein said position detecting means comprises detecting means for detecting that said shoulder portion is at a position to contact said contact member.

* * * * *